United States Patent
Sumiya et al.

(10) Patent No.: US 7,399,360 B2
(45) Date of Patent: Jul. 15, 2008

(54) CRUCIBLE AND METHOD OF GROWING SINGLE CRYSTAL BY USING CRUCIBLE

(75) Inventors: Keiji Sumiya, Tsukuba (JP); Nachimuthu Senguttuvan, Tsukuba (JP); Hiroyuki Ishibashi, Hitachinaka (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 63 days.

(21) Appl. No.: 10/563,087

(22) PCT Filed: Jun. 18, 2004

(86) PCT No.: PCT/JP2004/008624

§ 371 (c)(1),
(2), (4) Date: Dec. 30, 2005

(87) PCT Pub. No.: WO2005/003413

PCT Pub. Date: Jan. 13, 2005

(65) Prior Publication Data

US 2006/0174822 A1    Aug. 10, 2006

(30) Foreign Application Priority Data

| Jul. 3, 2003 | (JP) | 2003-270771 |
| Jul. 3, 2003 | (JP) | 2003-270773 |
| Jul. 3, 2003 | (JP) | 2003-270774 |
| Jul. 3, 2003 | (JP) | 2003-270778 |
| Jul. 31, 2003 | (JP) | 2003-284047 |
| Sep. 26, 2003 | (JP) | 2003-336015 |

(51) Int. Cl.
*C30B 11/00* (2006.01)
*C30B 29/12* (2006.01)

(52) U.S. Cl. .................. 117/213; 117/207; 117/220; 117/12; 117/18; 117/31; 117/49; 117/81; 117/83

(58) Field of Classification Search .............. 117/83, 117/81, 82, 2, 12, 18, 31, 49, 207, 213, 220
See application file for complete search history.

(56) References Cited

U.S. PATENT DOCUMENTS 4,946,544 A * 8/1990 Ejim ..................... 117/78

(Continued)

FOREIGN PATENT DOCUMENTS

JP         57-071900      5/1982

(Continued)

OTHER PUBLICATIONS

Translation of International Preliminary Report dated Jan. 7, 2005.

*Primary Examiner*—Yogendra N. Gupta
*Assistant Examiner*—Seyed Masoud Malekzadeh
(74) *Attorney, Agent, or Firm*—Antonelli, Terry, Stout & Kraus, LLP.

(57) ABSTRACT

Provided are a crucible which prevents polycrystal formation to easily allow growth of optical part material single crystals, and a single crystal growth method employing the crucible. The crucible has a smooth surface of about Rmax 3.2s as the surface roughness of the wall surface 1H, concave curved plane 1J, cone surface 1F and convex curved plane 1L of the starting material carrying section 1D and the wall surface 1K of the seed carrying section 1E, which constitute the inner surface of the crucible of a crucible body 1A.

4 Claims, 9 Drawing Sheets

U.S. PATENT DOCUMENTS

| | | | |
|---|---|---|---|
| 5,169,486 A * | 12/1992 | Young et al. | 117/83 |
| 5,830,269 A * | 11/1998 | Kawase et al. | 117/83 |
| 2003/0089299 A1 * | 5/2003 | Obara et al. | 117/2 |
| 2003/0154911 A1 * | 8/2003 | Eissler | 117/81 |
| 2004/0089023 A1 * | 5/2004 | Hiraiwa et al. | 65/30.1 |

FOREIGN PATENT DOCUMENTS

| | | |
|---|---|---|
| JP | 03-290390 | 12/1991 |
| JP | 10-265296 | 10/1998 |
| JP | 11-199362 | 7/1999 |
| JP | 2000-272990 | 10/2000 |
| JP | 2000-272991 | 10/2000 |
| JP | 2002-029882 | 1/2002 |
| JP | 2002-308697 | 10/2002 |

\* cited by examiner

Fig.9

| | BOUNDARY POSITION BETWEEN MELTED PORTION AND UNMELTED PORTION OF SEED CRYSTAL UPON TERMINATION OF HEATING [HEIGHT FROM BOTTOM OF SEED CRYSTAL CARRYING SECTION] (mm) | STATE OF FORMED CRYSTAL | NUMBER OF POORLY FORMED CRYSTALS (WITH LESS THAN 50 vol%) |
|---|---|---|---|
| EXP.EXAMPLE 13 | 50 | SINGLE CRYSTAL | 2/10 |
| EXP.EXAMPLE 14 | 80 | SINGLE CRYSTAL | 5/10 |
| EXP.EXAMPLE 15 | 70 | SINGLE CRYSTAL | 3/10 |
| EXP.EXAMPLE 16 | 60 | SINGLE CRYSTAL | 3/10 |
| EXP.EXAMPLE 17 | 40 | SINGLE CRYSTAL | 3/10 |
| EXP.EXAMPLE 18 | 25 | SINGLE CRYSTAL | 5/10 |
| EXP.EXAMPLE 19 | 85 | POLYCRYSTAL | 7/10 |
| EXP.EXAMPLE 20 | 20 | POLYCRYSTAL | 8/10 |

CRUCIBLE AND METHOD OF GROWING SINGLE CRYSTAL BY USING CRUCIBLE

TECHNICAL FIELD

The present invention relates to a crucible for growth of a single crystal by melting and cooling optical part materials such as calcium fluoride, and to a single crystal production method using the crucible.

BACKGROUND ART

The Vertical Bridgman (VB) method is a known method for producing single crystals of calcium fluoride. The VB method involves moving a crucible carrying a calcium fluoride material vertically through a crystal growth furnace which has a temperature gradient near the melting point of the calcium fluoride material. In other words, first the crucible is raised to melt the calcium fluoride material, and then it is gradually lowered in temperature (i.e. cooled) for gradual crystallization from bottom to top to grow a single crystal of the calcium fluoride. In some methods, the calcium fluoride material is melted by simple temperature control of the heater of the crystal growth furnace, without raising the temperature of the crucible.

As an example of a crucible used for the VB method there may be mentioned the crucible described in patent document 1. The crucible disclosed in patent document 1 has a construction such that the calcium fluoride grows in a single crystal along the crystal plane of the seed (seed crystal), and it comprises a large-diameter starting material carrying section in which the calcium fluoride material is loaded, and a small-diameter seed carrying section situated below the starting material carrying section, wherein the calcium fluoride seed is loaded; the starting material carrying section and seed carrying section are connected via a tapered cone surface.

DISCLOSURE OF THE INVENTION

Problems to be Solved by the Invention

The present inventors found that cooling of the calcium fluoride melted in the aforementioned crucible tends to produce polycrystals or a heterophase, making it difficult to easily grow a single crystal of calcium fluoride.

It is therefore an object of the present invention to provide a crucible which inhibits polycrystallization (heterophase formation) and aids single crystal growth, in order to facilitate growth of single crystals of optical part materials such as calcium fluoride, as well as a method for growing single crystals.

As a result of much diligent research, the present inventors discovered that the problem described above occurs for the following reason.

Specifically, when the optical part material such as calcium fluoride which has melted in the crucible crystallizes along the crystal plane of the seed upon cooling, fine irregularities act as nuclei on the inner surface of the crucible and thus tend to cause production of polycrystals or a heterophase. When the optical part material contracts upon cooling, the optical part material such as calcium fluoride adheres to the inner surface of the crucible and creates residual stress or warping in the crystals, tending to form the origins of crystal boundaries and thus contributing to the polycrystals or heterophase.

The present inventors therefore conducted diligent research with the aim of overcoming the problem described above, and discovered that the problem can be overcome by the following invention.

Specifically, the crucible of the invention is a crucible for growth of a single crystal along the crystal plane of a seed by melting and cooling an optical part material, characterized in that the surface roughness of the inner surface of the crucible as measured by the maximum height method is no greater than Rmax 6.4s. Throughout the present specification, the surface roughness Rmax is the value according to JIS B0601-1982.

Since the inner surface of the crucible of the invention is a smooth surface with a surface roughness of no greater than Rmax 6.4s, the optical part material which has melted in the crucible crystallizes along the crystal plane of the seed upon cooling, thereby inhibiting formation of polycrystal-producing nuclei on the inner surface of the crucible. In addition, since the optical part material easily separates from the inner surface of the crucible as a result of contraction by cooling, residual stress or warping in the crystals of the optical part material is inhibited. As a result, it is easy to grow a single crystal of the optical part material.

The surface roughness of the inner surface of the crucible of the invention by the maximum height method is preferably no greater than Rmax 3.2s, and more preferably no greater than Rmax 2.0s.

If the inner surface of the crucible of the invention is composed of glossy vitrified carbon, it will be easy to obtain a crucible inner surface with a surface roughness of no greater than Rmax 3.2s. In this case, the crucible body is preferably constructed of a carbon material which has high heat resistance and readily produces a smooth surface.

The present inventors further discovered that the problem described above also occurs for the following reason.

Specifically, when the optical part material which has melted in the crucible crystallizes along the crystal plane of the seed upon cooling, nuclei are formed by the corner of the boundary between the wall surface and the cone surface of the starting material carrying section of the crucible inner surface and by the corner of the boundary between the cone surface and the wall surface of the seed carrying section, thereby tending to cause formation of polycrystals and a heterophase. Also, when the optical part material contracts by cooling, the optical part material adheres to the corners on the inner surface of the crucible, creating residual stress or warping in the crystals, which form the origins of crystal boundaries and thus contribute to formation of polycrystals or a heterophase; as a result, a single crystal of the optical part material does not readily grow.

The present inventors therefore conducted further diligent research and found that this problem can be solved by the following invention. Specifically, the crucible of the invention is a crucible for growth of a single crystal along the crystal plane of a seed by melting and cooling an optical part material, characterized in that a tapered cone surface is formed between the starting material carrying section in which the optical part material is loaded and the seed carrying section in which the seed is loaded, the wall surface of the starting material carrying section is smoothly connected to the cone surface via a concave curved plane (i.e., a concave curved surface), and the cone surface is smoothly connected to the wall surface of the seed carrying section via a convex curved plane (i.e., a convex curved surface).

In the crucible of the invention, the wall surface of the starting material carrying section is smoothly connected to the cone surface via a concave curved plane and the cone surface is smoothly connected to the wall surface of the seed carrying section via a convex curved plane, such that when the optical part material which has melted in the crucible crystallizes along the crystal plane of the seed upon cooling, generation of nuclei responsible for polycrystallization on the crucible inner surface is inhibited. In addition, since the optical part material easily separates from the crucible inner surface as a result of contraction by cooling, residual stress or warping in the crystals of the optical part material is inhibited. As a result, it is easy to grow a single crystal of the optical part material.

In the crucible of the invention, the curvature radius of the curved plane connecting the wall surface of the starting material carrying section of the crucible inner surface, the cone surface and the walls surface of the seed carrying section is preferably at least 1/10, more preferably at least 1/6 and most preferably at least 1/4 of the inner diameter between the wall surfaces of the starting material carrying section.

The present inventors further discovered that the problem described above also occurs for the following reason.

Specifically, when the optical part material which has melted in the crucible crystallizes along the crystal plane of the seed upon cooling, if the cone angle of the cone surface is too small, residual stress or warping can result in the crystals, tending to form the origins of crystal boundaries and thus contributing to the polycrystals or heterophase. On the other hand, if the cone angle of the cone surface is too large, growth of the single crystal will be inhibited, making it impossible to easily achieve growth of a single crystal of the optical part material.

The present inventors therefore conducted further diligent research and found that this problem can be solved by the following invention.

Specifically, the crucible of the invention is a crucible for growth of a single crystal along the crystal plane of a seed by melting and cooling an optical part material, characterized in that the cone angle of the tapered cone surface formed between the starting material carrying section in which the optical part material is loaded and the seed carrying section in which the seed is loaded is set in a range between 95° and 150°.

Since the cone angle of the cone surface in the crucible of the invention is set to at least 95°, residual stress or warping in the crystals which produces crystal boundaries is inhibited, and thus polycrystallization (heterophase formation) is inhibited, when the optical part material which has melted in the crucible crystallizes along the crystal plane of the seed upon cooling. Also, since the cone angle of the cone surface is set to no greater than 150°, growth of a single crystal is aided. As a result, single crystals of the optical part material can be easily grown.

In the crucible of the invention, the cone angle of the cone surface is preferably set in a range between 105° and 140°, and more preferably in a range between 120° and 130°.

The present inventors further discovered that the problem described above also occurs for the following reason.

Specifically, when the optical part material melted in the crucible contracts by cooling, the optical part material adheres to the crucible inner surface, creating residual stress or warping in the crystals and thus forming the origins of crystal boundaries and contributing to formation of polycrystals or a heterophase; as a result, a single crystal of the optical part material does not readily grow.

The present inventors therefore conducted further diligent research toward a solution to the problem. The following conclusion was reached as a result of experimentation on the growth of single crystals of optical part materials in crucibles. Specifically, it was confirmed that a higher degree of wettability between the crucible inner surface and water droplets permits more satisfactory single crystal growth. In addition, it was found that if the contact angle between the crucible inner surface and water droplets is 100° or smaller, the wettability between the crucible inner surface and the optical part material solution is lower, thereby allowing satisfactory growth of a single crystal, and the present invention was thereupon completed.

In other words, the crucible of the invention is a crucible for growth of a single crystal along the crystal plane of a seed by melting and cooling an optical part material, characterized in that the contact angle between the crucible inner surface and water droplets is no greater than 100°.

Since the contact angle between the crucible inner surface and water droplets in the crucible of the invention is 100° or smaller and wettability between the crucible inner surface and the optical part material solution is low, the optical part material easily separates from the crucible inner surface when the optical part material melted in the crucible contracts by cooling, and therefore residual stress or warping in the crystals of the optical part material is inhibited. As a result, it is easy to grow a single crystal of the optical part material.

In the crucible of the invention, the contact angle between the crucible inner surface and water droplets in the crucible of the invention is preferably 90° or smaller and more preferably 85° or smaller. The crucible inner surface is preferably composed of vitrified carbon, and the sections other than the crucible inner surface are preferably composed of a carbon material.

The present inventors further discovered that the problem described above also occurs for the following reason.

Specifically, when a single crystal of an optical part material is grown using the crucible described above, the crucible carrying the seed in the seed carrying section and the optical part starting material in the starting material carrying section is set in a crystal growth furnace and a vacuum is created in the interior of the crystal growth furnace while forming a temperature gradient, to raise and lower the crucible and produce melting and cooling of the starting material and a portion of the seed for single crystal growth. It is difficult to control the temperature so that only a portion of the seed melts during melting of the optical part starting material, and the seed may melt entirely in some cases. Melting of the entirety of the seed makes it difficult to obtain a single crystal with the desired crystal orientation. In other words, the yield of desired single crystals is vastly reduced.

The crucible is therefore connected to a cooling rod via a support rod, and the crucible is cooled by the cooling rod through the support rod during melting of the starting material, thereby cooling the bottom of the seed.

However, because the seed carrying section of the crucible used for the single crystal growth method described above is usually formed by a point ended drill, the bottom face of the seed carrying section is conical. On the other hand, the bottom of the seed is generally flat. Consequently, when the seed is loaded in the seed carrying section, a gap remains between the seed bottom face and the seed carrying section bottom face. As a result, the bottom of the seed is not sufficiently cooled during melting of the starting material, potentially resulting in melting of the entirety of the seed and hampering efforts to obtain a single crystal with the desired crystal orientation.

The present inventors therefore conducted further diligent research and found that this problem can be solved by the following aspect of the invention.

Specifically, the present invention provides a crucible for growth of a single crystal along the crystal plane of an optical part material seed by melting and cooling an optical part material, characterized by comprising a starting material carrying section in which the optical part starting material is loaded and a seed carrying section in which the seed is loaded, wherein the bottom of the seed carrying section has a shape matching the edge of the seed.

Since the bottom of the seed carrying section has a shape matching the edge of the seed in this crucible, it is possible to adequately reduce the gap formed between the surface of the seed carrying section bottom and the seed edge surface when the seed is loaded in the seed carrying section. As a result, when the optical part material is further loaded as the starting material in the starting material carrying section of the crucible and the starting material is melted while cooling the bottom of the seed through the crucible, the seed bottom is kept sufficiently cooled. Consequently, melting of the entirety of the seed can be adequately prevented.

Specifically, in the crucible described above, the edge of the seed has an end face and sides connected to the end face, while the bottom of the seed carrying section has a bottom face and a wall surface which is connected to the bottom face and matches the sides of the seed, wherein both the end face and the bottom face are flat surfaces.

The present invention further provides a single crystal growth method whereby a single crystal of an optical part material is grown using the aforementioned crucible, characterized by comprising a seed loading step in which a seed having an edge with a shape matching the bottom of the seed carrying section is loaded as a seed in the seed carrying section of the crucible, a starting material loading step in which the optical part material is loaded as the starting material in the starting material carrying section, and a growth step in which a single crystal of the optical part material is grown along the crystal planes of the seed by melting and cooling the starting material in the crucible.

According to this single crystal growth method, the bottom of the seed carrying section has a shape matching the edge of the seed, and therefore when the seed is loaded in the seed carrying section of the crucible, the gap formed between the surface of the bottom of the seed carrying section and the edge surface of the seed can be adequately minimized. As a result, when the optical part material is further loaded as the starting material in the starting material carrying section of the crucible and the starting material is melted while cooling the bottom of the seed through the crucible, the bottom of the seed is kept sufficiently cooled. Consequently, melting of the entirety of the seed can be adequately prevented.

The present inventors further discovered that the problem described above also occurs for the following reason.

Specifically, by growing a single crystal in the crucible using the unmelted portion of the seed loaded in the seed carrying section as the seed, it is possible to achieve a uniform crystal orientation. If the entirety of the seed in the seed carrying section is melted it becomes impossible to control the orientation. However, the desired result cannot be achieved even if the seed portion near the top area of the seed carrying section has been melted. Experience has shown that subsequent single crystal growth is satisfactorily accomplished if the seed portion near the center area of the seed carrying section is melted. It has therefore been the conventional practice to control the temperature of the heater of the crystal growth furnace so that the seed melts up to the center area of the seed carrying section.

With this single crystal growth method, however, it has been difficult to consistently melt the seed in the seed carrying section to the desired point because of differences in the material components, and depending on the degree of vacuum in the crystal growth furnace or the temperature of the cooling water when cooling water is used to control cooling of the crucible. As a result, repeated trial and error has been indispensable for melting of a seed in the seed carrying section to the desired point in order to obtain the desired single crystal.

The present inventors therefore conducted further diligent research and found that this problem can be solved by the following invention.

Specifically, the present invention provides a crucible for growth of a single crystal characterized by comprising a closed-bottom seed carrying section extending in the vertical direction, in which the seed is loaded, a starting material carrying section in which a single crystal of the starting material is loaded, which is situated above the seed carrying section and is connected to the seed carrying section, and temperature detecting means for detection of the internal temperature of the seed carrying section. Here, the "vertical direction" is the upright direction.

The invention further provides a single crystal growth method for an optical part material using the aforementioned crucible, which method comprises a step of preparing a crucible, a step of loading the seed of the optical part material in the seed carrying section, a step of loading the starting material for the single crystal of the optical part material in the starting material carrying section, a step of situating the crucible in a crystal growth furnace heated in such a manner that the interior has a specified temperature gradient in the vertical direction, and heating the crucible so that the starting material loaded in the starting material carrying section and the seed loaded in the seed carrying material gradually melt from top to bottom, a step of detecting the internal temperature of the seed carrying section by the temperature detecting means during heating of the crucible, and a step of terminating the heating and commencing cooling for growth of a single crystal when, based on the internal temperature of the seed carrying section detected by the temperature detecting means, the boundary position between the melted portion and unmelted portion of the seed loaded in the seed carrying section is judged to be between a first position which is at a prescribed height above the bottom end of the seed carrying section and a second position which is at a prescribed height above the first position.

Thus, since the internal temperature of the seed carrying section can be detected by the temperature detecting means, it is possible to easily determine the boundary position between the melted and unmelted sections of the seed loaded in the seed carrying section, based on the internal temperature detected.

The temperature detecting means may be a thermocouple, and the thermocouple is preferably situated at a location near the side wall of the seed carrying section. This will facilitate measurement of the temperature of the seed near the area in which the thermocouple is situated.

Also, a plurality of thermocouples are preferably situated at mutually separated spacings in the vertical direction. This will allow the temperature gradient of the seed carrying section to be known based on the position of each thermocouple and the temperature measured from each thermocouple.

Here, it is effective if one of the two thermocouples is situated at a position at a height above the bottom end of the seed carrying section corresponding to 25-50% of the depth of the seed carrying section, while the other is situated at a position at a height above the bottom end of the seed carrying section corresponding to 60-80% of the depth of the seed carrying section. Thus, if the seed melts within the range defined by the two thermocouple positions, satisfactory growth of a single crystal will occur thereafter. Such a state can be easily confirmed based on whether the melting point of the seed falls between the temperatures measured by the two thermocouples.

According to the optical part material single crystal growth method of the invention, it is effective if the first position is a position at a height above the bottom end of the seed carrying section corresponding to 25% of the depth of the seed carrying section, and the second position is a position at a height above the bottom end of the seed carrying section corresponding to 80% of the depth of the seed carrying section. If heating is terminated and cooling initiated for single crystal growth when the boundary position between the melted and unmelted portions of the seed loaded in the seed carrying section falls between the first and second positions, the single crystal of the optical part material will grow satisfactorily along the crystal plane of the unmelted portion of the seed.

The crucible and single crystal growth method using it which are described above are particularly effective when the optical part material is calcium fluoride.

Effect of the Invention

If the surface roughness of the inner surface of the crucible is no greater than Rmax 6.4s, i.e. if the surface is smooth, generation of polycrystal-forming nuclei on the crucible inner surface is inhibited when the calcium fluoride melted in the crucible crystallizes along the crystal surface of the seed by cooling. In addition, since the calcium fluoride easily separates from the crucible inner surface when it contracts by cooling, residual stress and warping in the calcium fluoride crystals are inhibited. According to the invention, therefore, it is possible to easily grow single calcium fluoride crystals.

If the wall surface of the starting material carrying section is smoothly connected to the cone surface via a concave curved plane and the cone surface is smoothly connected to the wall surface of the seed carrying section via a convex curved plane, in the crucible of the invention, generation of polycrystal-forming nuclei on the crucible inner surface will be inhibited when the calcium fluoride melted in the crucible crystallizes along the crystal surface of the seed by cooling. Also, since the calcium fluoride easily separates from the crucible inner surface when it contracts by cooling, residual stress and warping in the calcium fluoride crystals are inhibited. According to the invention, therefore, it is possible to easily grow a single calcium fluoride crystal.

Furthermore, if the cone angle of the cone surface in the crucible of the invention is set to at least 95°, residual stress or warping in the crystals which produces crystal boundaries will be inhibited, and thus polycrystallization (heterophase formation) will be inhibited, when the calcium fluoride which has melted in the crucible crystallizes along the crystal plane of the seed upon cooling. Also, since the cone angle of the cone surface is set to no greater than 150°, growth of a single crystal will be aided. According to the invention, therefore, it is possible to easily grow single calcium fluoride crystals.

Moreover, if the contact angle between the crucible inner surface and water droplets is 100° or smaller and wettability between the crucible inner surface and the calcium fluoride solution is low in the crucible of the invention, the calcium fluoride will easily separate from the crucible inner surface when the calcium fluoride melted in the crucible contracts by cooling, and therefore residual stress or warping in the crystals of the calcium fluoride will be inhibited. According to the invention, therefore, it is possible to easily grow single calcium fluoride crystals.

According to the crucible of the invention and the single crystal growth method employing the crucible of the invention, wherein the crucible comprises a starting material carrying section in which an optical part material is loaded as the starting material and a seed carrying section in which the seed is loaded, if the bottom of the seed carrying section has a shape matching the edge of the seed, the seed bottom can be kept sufficiently cooled during melting of the starting material while cooling the seed bottom via the crucible, when the seed is loaded in the seed carrying section and the starting material is loaded in the starting material carrying section. Consequently, melting of the entirety of the seed can be adequately prevented, and a single crystal can be easily grown.

In addition, if the crucible is provided with the aforementioned temperature detecting means, for the crucible of the invention and the single crystal growth method employing it, the boundary position between the melted portion and unmelted portion of the seed loaded in the seed carrying section can be easily determined, thereby allowing growth of a single crystal of the calcium fluoride to be accomplished more reliably.

BRIEF DESCRIPTION OF THE DRAWINGS

FIG. 9 is a table showing the experimental results of crystal state and yield for Experimental Examples 13-20 of the invention.

EXPLANATION OF SYMBOLS

1 Crucible
1A Crucible body
1B Cover member
1C Bottom member
1D Starting material carrying section
1E Seed carrying section
1F Cone surface
1H Wall surface of starting material carrying section
1J Concave curved plane
1K Wall surface of seed carrying section
1L Convex curved plane
2 Vacuum VB furnace (Crystal growth apparatus furnace)
2A Heater
2B Shaft 2C Vacuum pump
2D Heat transfer member
M Calcium fluoride (CaF$_2$) starting material
S Calcium fluoride (CaF$_2$) seed (seed crystal)
S1 Seed end face
1CA, 1CB Thermocouples (temperature detecting means)
100 Crystal growth apparatus

BEST MODE FOR CARRYING OUT THE INVENTION

Figure 1:
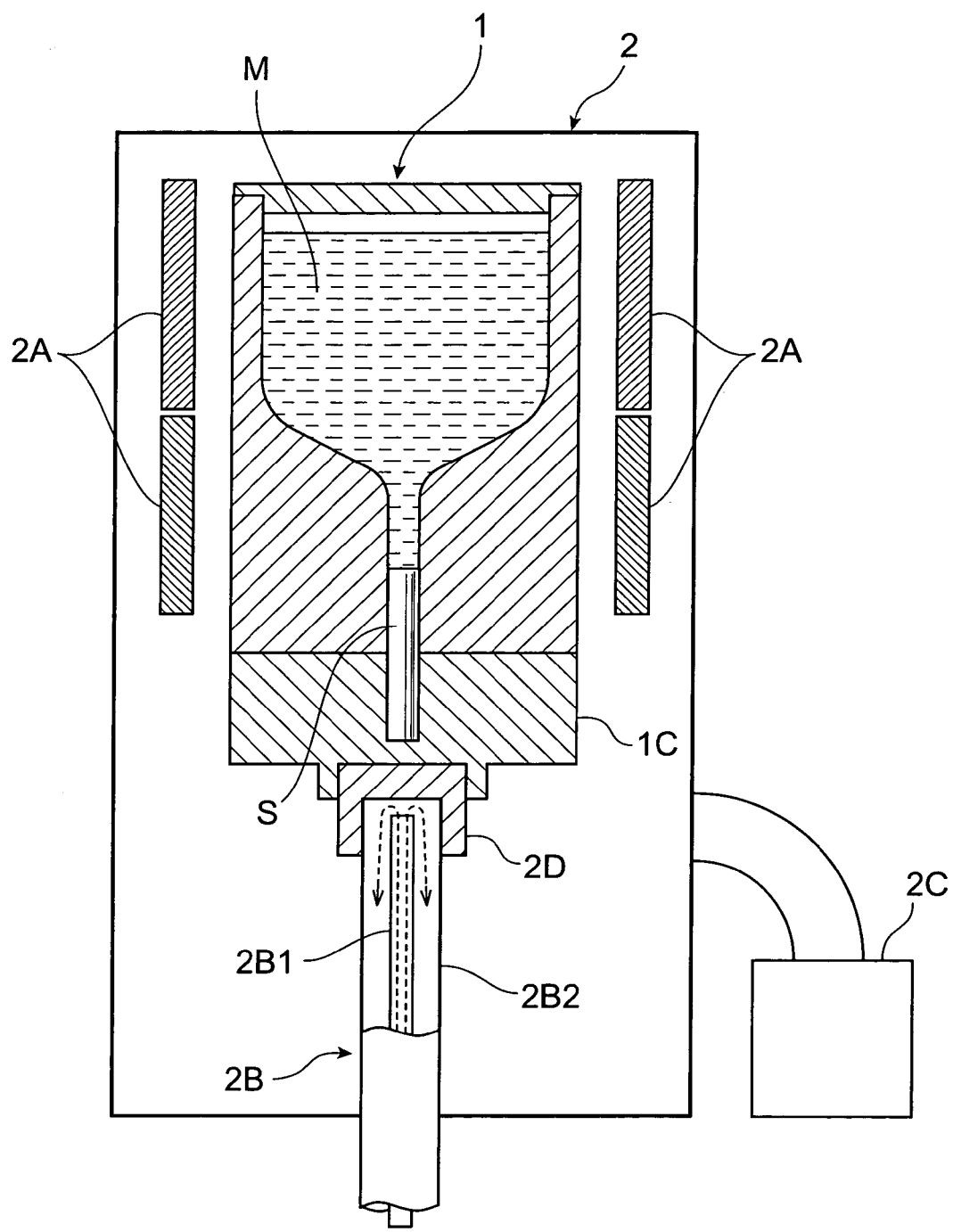
FIG. 1 is a schematic diagram showing the general structure of a vacuum VB furnace provided with a crucible according to an embodiment of the invention.
Figure 2:
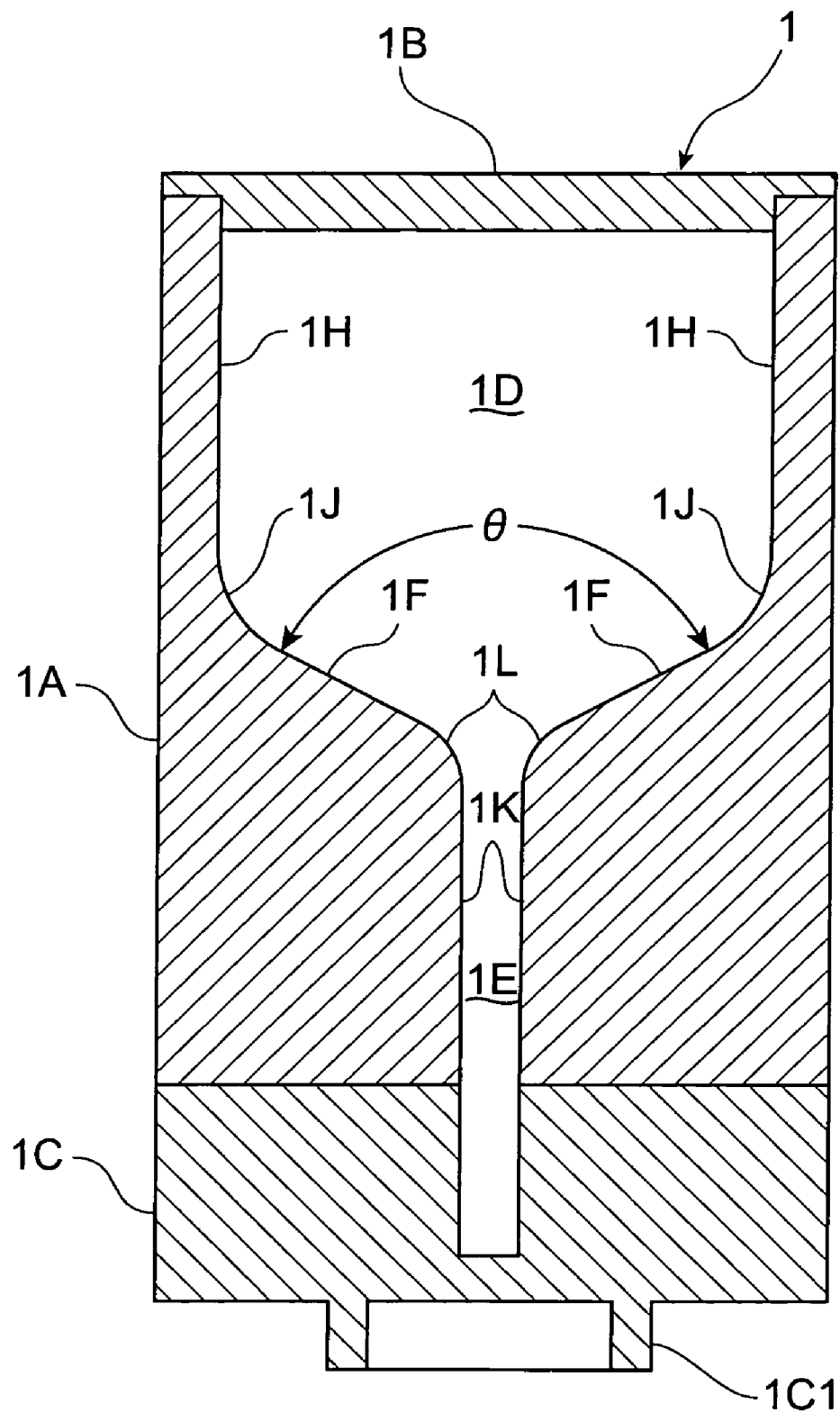
FIG. 2 is a cross-sectional view showing the structure of a crucible according to the embodiment shown in FIG. 1.

Embodiments of the crucible of the invention will now be explained with reference to the accompanying drawings. Of the drawings, FIG. 1 is a schematic diagram showing the general structure of a vacuum VB furnace provided with a crucible according to an embodiment, and FIG. 2 is a cross-sectional view showing the structure of a crucible according to the embodiment shown in FIG. 1. These embodiments will be explained with the assumption that the seed (seed crystal) is composed of calcium fluoride.

First Embodiment

As shown in FIG. 1, the crucible 1 of this embodiment is situated on the inner side of a heater 2A in a vacuum Vertical Bridgman (hereinafter abbreviated as "VB") furnace, as a single crystal growth apparatus for the VB method. The crucible 1 is raised and lowered at an imperceptible speed via a shaft 2B to melt the calcium fluoride (CaF$_2$) starting material M and then cooled to grow a single crystal along the crystal plane of, for example, the (111) orientation of a seed (seed crystal) S composed of a calcium fluoride (CaF$_2$) single crystal.

The pressure inside the vacuum VB furnace 2 is reduced to below 10$^{-4}$ Pa using a vacuum pump 2C, and the heater 2A is used for heating to around, for example, 1400-1500° C. In order to prevent melting of the seed S by heating with the heater 2A, the shaft 2B of the vacuum VB furnace 2 comprises a cooling water circulation channel.

That is, the shaft 2B is composed of a double conduit wherein the upper end of the inner conduit 2B1 is retired from the upper end of the outer conduit 2B2, with a cap-like heat transfer member 2D fitted at the upper end. Also, the heat transfer member 2D is connected to the center of the bottom member 1C of the crucible 1 described hereunder, for a construction wherein the lower part of the seed S is forcefully cooled.

As shown in FIG. 2, the crucible 1 comprises a crucible body 1A, a cap member 1B which covers the opening of the crucible body 1A, and a bottom member 1C anchored to the lower part of the crucible body 1B. The crucible body 1A is heat resistant, and is made of a high-purity carbon material (C), as a material which increases the smoothness of the inner wall, while the inner wall is coated with glass-like carbon (GC) which is glossy and capable of lowering the wettability with the calcium fluoride (CaF$_2$) solution.

A large-diameter starting material carrying section 1D, in which the calcium fluoride (CaF$_2$) starting material M (FIG. 1) is loaded, is formed in the crucible body 1A. The starting material carrying section 1D comprises a cylindrical wall surface 1H, a concave curved plane 1J formed in connection with the bottom member 1C end of the wall surface 1H, and a tapered (funnel-shaped) cone surface 1F formed in connection with the bottom member 1C end of the concave curved plane 1J. Thus, the cone surface 1F forms the bottom of the starting material carrying section 1D. A small seed carrying section 1E in which the cylindrical seed S (see FIG. 1) is loaded is formed as a straight circular hole at the center section from the crucible body 1A, through the bottom member 1C. The tapered (funnel-shaped) cone surface 1F forming the bottom of the starting material carrying section 1D is formed between the starting material carrying section 1D and the seed carrying section 1E.

The cap member 1B and bottom member 1C are also formed of a heat-resistant high purity carbon material. A connecting cylindrical section 1C1 is formed in a protruding manner at the center of the lower side of the bottom member 1C, for fitting of the heat transfer member 2D (shown in FIG. 1) which is anchored to the top end of the shaft 2B of the vacuum VB furnace 2.

A concave curved plane 1J is formed at the border section between the wall surface 1H and cone surface 1F of the starting material carrying section 1D, and the wall surface 1H and cone surface 1F of the starting material carrying section 1D are in a smooth connection via the concave curved plane 1J. Also, a convex curved plane 1L is formed at the border section between the cone surface 1F and the wall surface 1K of the seed carrying section 1E, and the cone surface 1F and the wall surface 1K of the seed carrying section 1E are in a smooth connection via the convex curved plane 1L.

The wall surface 1H of the starting material carrying section 1D is formed straight, and the inner diameter within the wall surface 1H may be set to, for example, 250 mm. The inner diameter of the seed carrying section 1E may be set to, for example, 20 mm.

If the cone angle θ of the cone surface 1F is too small, residual stress and warping will occur within the calcium fluoride (CaF$_2$) crystals grown in the starting material carrying section 1D, tending to result in polycrystallization or heterophase formation. On the other hand, if the cone angle θ of the cone surface 1F is too large, growth of the calcium fluoride (CaF$_2$) single crystals will tend to be inhibited. Therefore, the cone angle θ of the cone surface 1F is preferably set to within 95-150°, and most preferably 120-130°.

If the concave curved plane 1J and convex curved plane 1L have small curvature radii approaching angular forms, the angular concave curved plane 1J and convex curved plane 1L sections will tend to act as nuclei to produce polycrystals and a heterophase when the calcium fluoride (CaF$_2$) melted in the starting material carrying section 1D crystallizes by cooling. In addition, when the calcium fluoride (CaF$_2$) contracts upon cooling, the calcium fluoride (CaF$_2$) will adhere to the angular concave curved plane 1J and convex curved plane 1L to generate residual stress and warping inside the crystals, tending to produce polycrystals and a heterophase.

The curvature radii of the concave curved plane 1J and convex curved plane 1L are therefore set to be large curvature radii of at least ⅟₁₀ of the inner diameter within the wall surface 1H of the starting material carrying section 1D (for example, 250 mm). For example, the curvature radius of the concave curved plane 1J may be set to about 60 mm, and the curvature radius of the convex curved plane 1L may be set to about 50 mm.

Also, if surface roughness of the wall surface 1H or cone surface 1F of the starting material carrying section 1D is high, the minute irregularities in the wall surface 1H or cone surface 1F will tend to form polycrystals and a heterophase when the calcium fluoride (CaF$_2$) melted in the starting material carrying section 1D crystallizes upon cooling. In addition, shrinkage of the calcium fluoride (CaF$_2$) upon cooling will result in adhesion of the calcium fluoride (CaF$_2$) to the wall surface 1H or cone surface 1F to produce residual stress or warping inside the crystal, tending to produce polycrystals or a heterophase.

The inner wall of the crucible 1 extending from the wall surface 1H of the starting material carrying section 1D of the crucible body 1A, through the concave curved plane 1J, cone surface 1F and convex curved plane 1L, through to the wall surface 1K of the seed carrying section 1E, is finished to a surface roughness of no greater than Rmax 6.4s, such as no greater than 3.2s, according to the maximum height method. That is, the inner surface of the crucible body 1A composed of the high purity carbon material (C) is finished to, for example, about Rmax 6.4s, and the surface thereof is coated with glass-like carbon (GC) and finished to about Rmax 3.2s.

If the wettability between the crucible inner surface, such as the wall surface 1H or cone surface 1F of the starting material carrying section 1D, and the calcium fluoride ($CaF_2$) solution is high, shrinkage of the calcium fluoride ($CaF_2$) melted in the starting material carrying section 1D upon cooling will result in adhesion of the calcium fluoride ($CaF_2$) to the wall surface 1H or cone surface 1F to produce residual stress or warping inside the crystals, tending to produce polycrystals or a heterophase.

Thus, since the crucible inner surface composed of glass-like carbon (GC) having a surface roughness of no greater than Rmax 3.2s, i.e. the crucible inner wall extending from the wall surface 1H of the starting material carrying section 1D of the crucible body 1A, through the concave curved plane 1J, cone surface 1F and convex curved plane 1L, through to the wall surface 1K of the seed carrying section 1E, has low wettability with the calcium fluoride ($CaF_2$) solution, the water droplet contact angle is no greater than 100°, and for example, 90°.

In order to melt the calcium fluoride ($CaF_2$) starting material M shown in FIG. 1 in the crucible 1 having this construction, the inner surface of the heater 2A heated to about 1400-1500° C. is raised at an imperceptible speed of about 10 mm/h by the shaft 2B in the vacuum VB furnace 2 (see FIG. 1) at a reduced pressure of no greater than $10^{-4}$ Pa, and is held at that raised position for about 10 hours. During that period, the lower part of the seed S is forcefully cooled through the heat transfer member 2D by cooling water circulating in the shaft 2B from the inner conduit 2B1 to the outer conduit 2B2, thereby preventing melting of the sections other than the top of the seed S.

In order to cool the melted calcium fluoride ($CaF_2$) starting material M to grow a single crystal along the crystal plane of, for example, the (111) orientation of the seed (seed crystal) S, the crucible 1 is lowered by the shaft 2B at an imperceptible speed of no greater than 1.5 mm/h, such as about 1.0 mm/h for example, and is held at the lowered position in the vacuum VB furnace 2 for about 5 hours.

Then, the solidified calcium fluoride ($CaF_2$) in the crucible 1 is cooled at a cooling rate of no greater than 70° C./h, such as about 30° C./h for example, by ON/OFF control of the heater 2A of the vacuum VB furnace 2, in order to prevent quenching (cracking due to thermal shock).

In the crucible 1, the crucible inner wall extending from the wall surface 1H of the starting material carrying section 1D of the crucible body 1A, through the concave curved plane 1J, cone surface 1F and convex curved plane 1L, through to the wall surface 1K of the seed carrying section 1E, is finished to a smooth surface of, for example, about Rmax 3.2s. This inhibits generation of polycrystal-forming nuclei in the crucible when the melted calcium fluoride ($CaF_2$) in the starting material carrying section 1D cools and crystallizes along the crystal plane of the (111) orientation of the seed S.

Since the calcium fluoride ($CaF_2$) easily separates from the crucible inner surface upon contraction by cooling, generation of residual stress or warping inside the calcium fluoride ($CaF_2$) crystals is inhibited. Growth of the calcium fluoride ($CaF_2$) crystals is thus facilitated.

In the crucible 1, the wall surface 1H of the starting material carrying section 1D of the crucible body 1A is smoothly connected to the cone surface 1F via the concave curved plane 1J having a large curvature radius of about 60 mm, while the cone surface 1F is smoothly connected to the wall surface 1K of the seed carrying section 1E via the convex curved plane 1L having a large curvature radius of about 50 mm. In other words, the crucible inner surface which extends from the wall surface 1H of the starting material carrying section 1D, through the concave curved plane 1J, cone surface 1F and convex curved plane 1L, through to the wall surface 1K of the seed carrying section 1E, is smoothly continuous without any angularity.

Thus, generation of polycrystal-forming nuclei on the crucible inner surface is inhibited when the calcium fluoride ($CaF_2$) melted in the starting material carrying section 1D crystallizes along the crystal plane of the (111) orientation of the seed S upon cooling. Also, since the calcium fluoride ($CaF_2$) easily separates from the crucible inner surface upon contraction by cooling, generation of residual stress or warping inside the calcium fluoride ($CaF_2$) crystals is inhibited. Growth of the calcium fluoride ($CaF_2$) crystals thus occurs in a reliable manner.

The cone angle $\theta$ of the cone surface 1F of the crucible body 1A of the crucible 1 is set to at least 120° within the range of 95-150°, so that it is not too small or too large. This will inhibit residual stress or warping inside the crystals, and thus crystal boundary formation, when the calcium fluoride ($CaF_2$) melted in the starting material carrying section 1D crystallizes along the crystal plane of the (111) orientation of the seed S upon cooling, thus inhibiting polycrystallization (heterophase formation). The cone angle $\theta$ is also set to no greater than 130°. This will aid growth of a single crystal when the calcium fluoride ($CaF_2$) crystallizes along the crystal plane of the (111) orientation of the seed S upon cooling. Growth of the calcium fluoride single crystal can thereby be reliably achieved.

The inner wall of the crucible body 1 coated with glass-like carbon (GC), i.e., the crucible inner wall extending from the wall surface 1H of the starting material carrying section 1D of the crucible body 1A, through the concave curved plane 1J, cone surface 1F and convex curved plane 1L, through to the wall surface 1K of the seed carrying section 1E in the crucible 1, is finished to a water droplet contact angle of, for example, 90° to minimally reduce the wettability between the crucible inner surface and the calcium fluoride ($CaF_2$) solution.

Consequently, the calcium fluoride ($CaF_2$) melted in the crucible easily separates from the crucible inner surface upon contraction of the calcium fluoride ($CaF_2$) by cooling. As a result, generation of residual stress or warping inside the calcium fluoride ($CaF_2$) crystal is inhibited, so that growth of the calcium fluoride ($CaF_2$) single crystal is facilitated.

The inner surface of the crucible body 1 is also finished to a smooth surface of about Rmax 3.2s. Consequently, generation of polycrystal-forming nuclei on the crucible inner surface is inhibited when the calcium fluoride ($CaF_2$) melted in the starting material carrying section 1D crystallizes along the crystal surface of the (111) orientation of the seed S by cooling. As a result, growth of the calcium fluoride ($CaF_2$) single crystal is facilitated.

In addition, since the calcium fluoride ($CaF_2$) solidified in the crucible 1 is cooled at a cooling rate of no greater than 70° C./h, such as about 30° C./h, for example, quenching (cracking due to thermal shock) is prevented and a satisfactory single crystal is grown.

Figure 3:
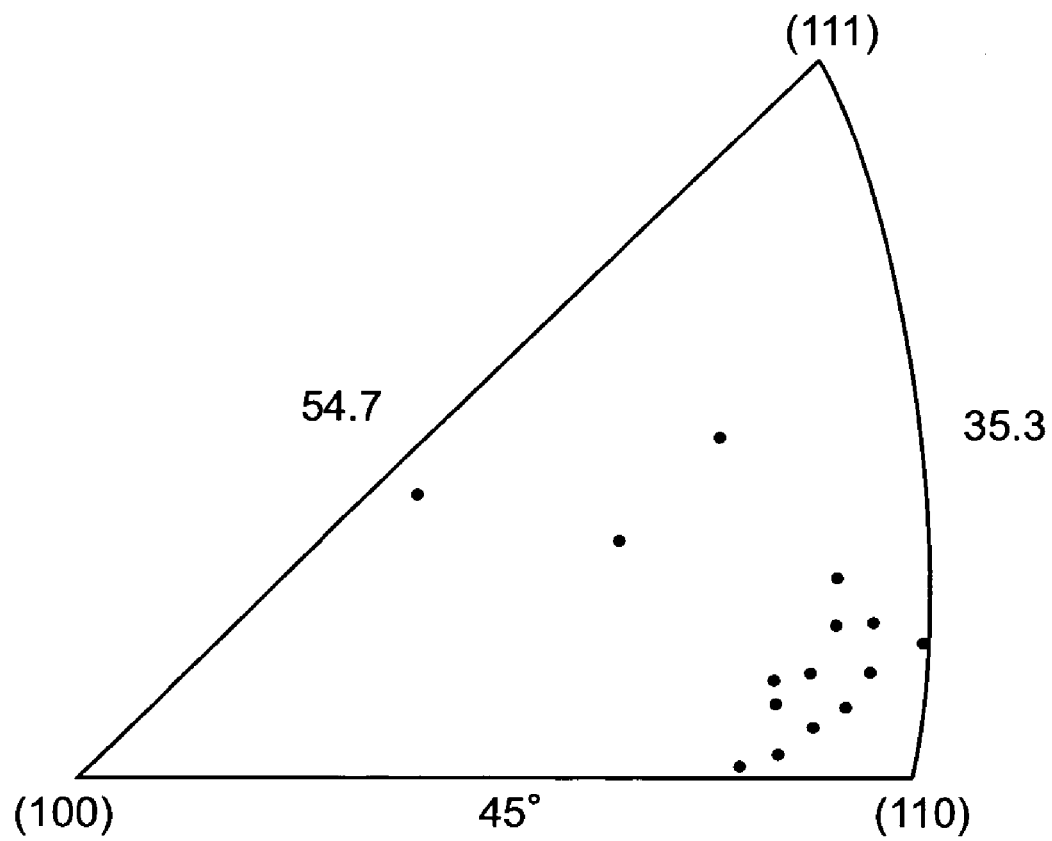
FIG. 3 is a point graph showing the distribution of crystal orientation for crystals obtained where the crucible shown in FIG. 1 was lowered into the vacuum VB furnace 2 at an imperceptible speed and the growth rate was 1.0 mm/h.
Figure 4:
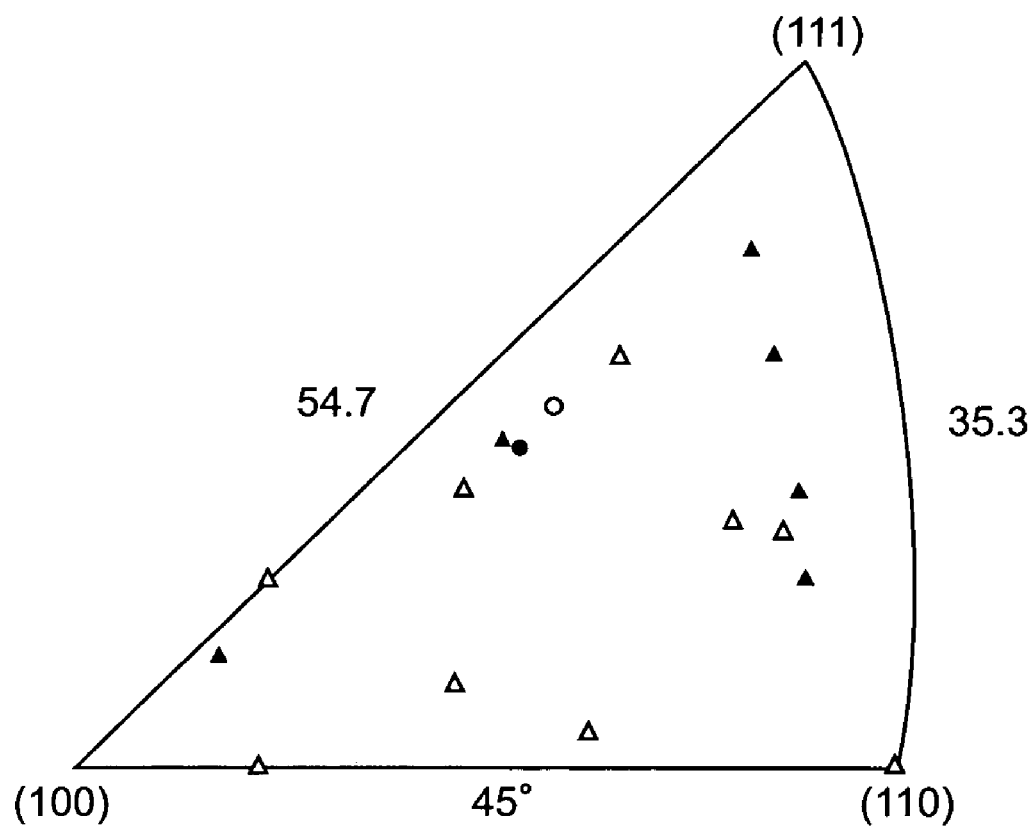
FIG. 4 is a point graph showing the distribution of crystal orientation for crystals obtained where the crucible shown in FIG. 1 was lowered into the vacuum VB furnace 2 at an imperceptible speed and the growth rate was 2.0 mm/h.

Furthermore, since the imperceptible speed at which the crucible 1 is lowered for cooling of the melted calcium fluoride (CaF$_2$) to grow a single crystal, i.e. the growth rate, is no greater than 1.5 mm/h, such as about 1.0 mm/h, for example, the crystal orientation of the grown single crystal is stable, as shown in FIG. 3. When the growth rate is 2 mm/h, which is above 1.5 mm/h, the crystal orientation clearly becomes dispersed and unstable as shown in FIG. 4.

Second Embodiment

Figure 5:
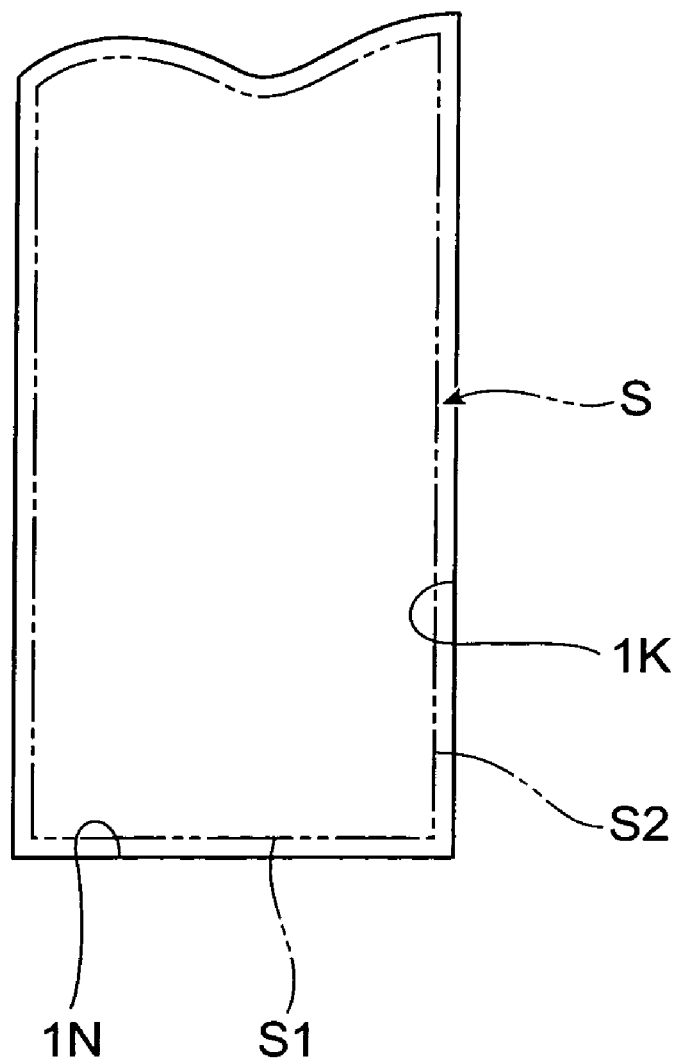
FIG. 5 is a magnified view of the bottom of the seed carrying section according to a second embodiment of the crucible of the invention.

A second embodiment of the crucible of the invention will now be explained. According to this embodiment, the crucible is suited for using a seed having a cylindrical shape and a flat edge. FIG. 5 is a magnified view of the bottom of the seed carrying section.

The crucible 1 of this embodiment has a construction similar to the first embodiment, except that the seed carrying section 1E has a shape matching the seed S. More specifically, the seed carrying section 1E has a construction wherein the bottom of the seed carrying section 1E is shaped to match the edge of the seed S.

The bottom of the seed carrying section 1E has such a shape matching the edge of the seed S in order to adequately minimize gaps between the side forming the bottom of the seed carrying section 1E and the edge surfaces of the seed S, when the seed S is loaded in the seed carrying section 1E.

More specifically, as shown in FIG. 5, the edge surface of the seed S has a flat end face S1 and a cylindrical side S2 vertical to the end face S1 and continuous with the end face S1, while the side forming the bottom of the seed carrying section 1E has a flat bottom face 1N and a cylindrical wall surface 1K vertical to the bottom face 1N and continuous with the bottom face 1N. The diameter within the wall surface 1K roughly matches the diameter of the seed S. The wall surface 1K of the seed carrying section is smaller than that of the wall surface 1H of the starting material carrying section 1D.

A method of growing a calcium fluoride single crystal as an optical part material using the crucible 1 described above will now be explained.

First, the crucible 1 is prepared, the cover member 1B is removed, and the calcium fluoride seed S is loaded into the seed carrying section 1E of the crucible 1 (seed loading step). The seed S has a cylindrical shape with a flat edge, and the diameter roughly matches the diameter of the wall surface 1K of the seed carrying section 1E. When the seed S is loaded into the seed carrying section 1E, at least the bottom of the seed carrying section 1E must conform to the edge of the seed S. Thus, it is possible to adequately reduce gaps between the side S2 of the seed S and the wall surface 1K of the seed carrying section 1E, and between the end face S1 of the seed S and the bottom face 1N of the seed carrying section 1E.

After the seed S has been loaded into the seed carrying section 1E, the calcium fluoride starting material M is loaded into the starting material carrying section 1D (starting material loading step).

The starting material carrying section 1D of the crucible body 1A is then closed with the cover member 1B.

Next, the pressure inside the vacuum VB furnace 2 is reduced to below 10$^{-4}$ Pa, and the heater 2A is heated to about 1400-1500° C. Also, the crucible 1 is raised at an imperceptible speed of about 10 mm/h by the shaft 2B and is held at the raised position for about 10 hours. During that period, since it is difficult to obtain a single crystal with the desired crystal orientation if the entire seed S is melted, the lower part of the seed S is forcefully cooled through the heat transfer member 2D by cooling water circulating in the shaft 2B from the inner conduit 2B1 to the outer conduit 2B2. If gaps form between the side S2 of the seed S and the wall surface 1K of the seed carrying section 1E, and between the end face S1 of the seed S and the bottom face 1N of the seed carrying section 1E during this time, the lower heat conductivity of the gaps compared to the carbon of the bottom member 1C will prevent adequately cooling of the bottom of the seed carrying section 1E; however, as mentioned above, gaps between the side S2 of the seed S and the wall surface 1K of the seed carrying section 1E, and between the end face S1 of the seed S and the bottom face 1N of the seed carrying section 1E, are adequately minimized in the crucible 1. Consequently, the bottom section of the seed S is sufficiently cooled so that melting of the entirety of the seed S can be satisfactorily prevented.

After the calcium fluoride starting material M has melted, the crucible 1 is lowered by the shaft 2B at an imperceptible speed of no greater than 1.5 mm/h, such as about 1.0 mm/h for example, and is held at the lowered position in the vacuum VB furnace 2 for about 5 hours. Thus, the melted calcium fluoride (CaF$_2$) starting material M is cooled to grow a single crystal along the crystal plane of the (111) orientation, for example, of the seed S (growth step).

Next, the solidified calcium fluoride (CaF$_2$) in the crucible 1 is cooled at a cooling rate of no greater than 70° C./h, such as about 30° C./h for example, by ON/OFF control of the heater 2A of the vacuum VB furnace 2, in order to prevent quenching (cracking due to thermal shock).

In the crucible 1, the crucible inner wall extending from the wall surface 1H of the starting material carrying section 1D of the crucible body 1A, through the concave curved plane 1J, cone surface 1F and convex curved plane 1L, through to the wall surface 1K of the seed carrying section 1E, is finished to a smooth surface of, for example, about Rmax 3.2s. This inhibits generation of polycrystal-forming nuclei on the crucible inner surface when the melted calcium fluoride (CaF$_2$) in the starting material carrying section 1D cools and crystallizes along the crystal plane of the (111) orientation of the seed S.

Since the calcium fluoride (CaF$_2$) easily separates from the crucible inner surface upon contraction by cooling, generation of residual stress or warping inside the calcium fluoride (CaF$_2$) crystals is inhibited. As a result, growth of the calcium fluoride (CaF$_2$) crystals is facilitated.

In addition, since the calcium fluoride (CaF$_2$) solidified in the crucible I1 is cooled at a cooling rate of no greater than 70° C./h, such as about 30° C./h, for example, quenching (cracking due to thermal shock) is prevented and a satisfactory single crystal is grown.

Furthermore, since the crucible 1 is lowered at an imperceptible speed for cooling of the melted calcium fluoride (CaF$_2$) to grow a single crystal, i.e. the growth rate is no greater than 1.5 mm/h, such as about 1.0 mm/h, for example, the crystal orientation of the grown single crystal is stable, as shown in FIG. 4. When the growth rate is 2 mm/h, which is above 1.5 mm/h, the crystal orientation clearly becomes dispersed and unstable, as shown in FIG. 5.

According to this embodiment, the wall surface 1K of the seed carrying section 1E of the crucible 1 is cylindrical, but the shape of the wall surface 1K may be prismatic if a prismatic seed is to be loaded.

Moreover, the bottom face of the seed carrying section 1E is flat in this case, but the bottom face of the seed carrying section is not limited to being a flat surface. If the end face S1 of the seed S is conical, the bottom face 1N of the seed carrying section 1E may be conical. That is, the bottom face 1N of the seed carrying section 1E may have any shape which can satisfactorily reduce gaps between the end face S1 of the seed S and the bottom face 1N of the seed carrying section 1E when the seed S is loaded into the seed carrying section 1E.

Third Embodiment

A third embodiment of the crucible of the invention will now be explained. As the drawings for reference, FIG. 6 is a schematic diagram showing the general structure of a crystal growth apparatus provided with a crucible according to this embodiment, and FIG. 7 is a cross-sectional view showing the structure of a crucible according to the embodiment shown in FIG. 6.

Figure 6:
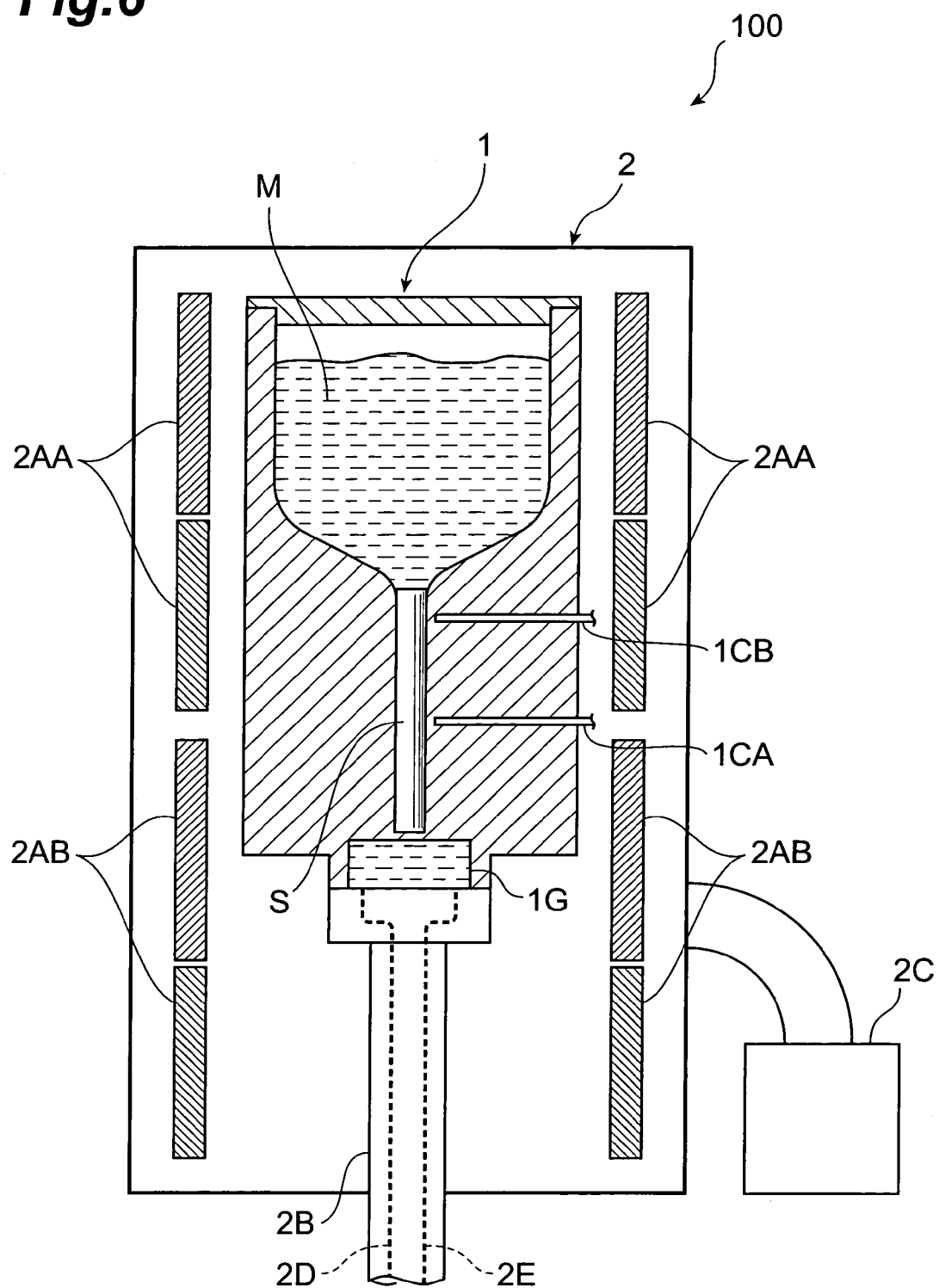
FIG. 6 is a schematic diagram showing the general structure of a vacuum VB furnace provided with a crucible according to a third embodiment of the invention.

As shown in FIG. 6, the crucible 1 of this embodiment is situated on the inner side of a primary heater 2AA and a secondary heater 2AB in a vacuum VB furnace 2, as a single crystal growth apparatus 100 for the VB method. The crucible 1 is raised at an imperceptible speed via a shaft 2B to melt the calcium fluoride starting material M and then lowered at an imperceptible speed via the shaft 2B to cool the starting material M, in order to grow a single crystal along the crystal plane of, for example, the (111) orientation of the seed S composed of a calcium fluoride single crystal.

The pressure inside the vacuum VB furnace 2 is reduced to below $10^{-4}$ Pa using a vacuum pump 2C, and the upper portion of the vacuum VB furnace 2 is heated to, for example, about 1600° C. by the primary heater 2AA. The bottom portion of the vacuum VB furnace 2 is heated by the secondary heater 2AB. Cooling water channels 2D, 2E are formed through a water jacket 1G described hereunder, in the shaft 2B of the vacuum VB furnace 2.

Figure 7:
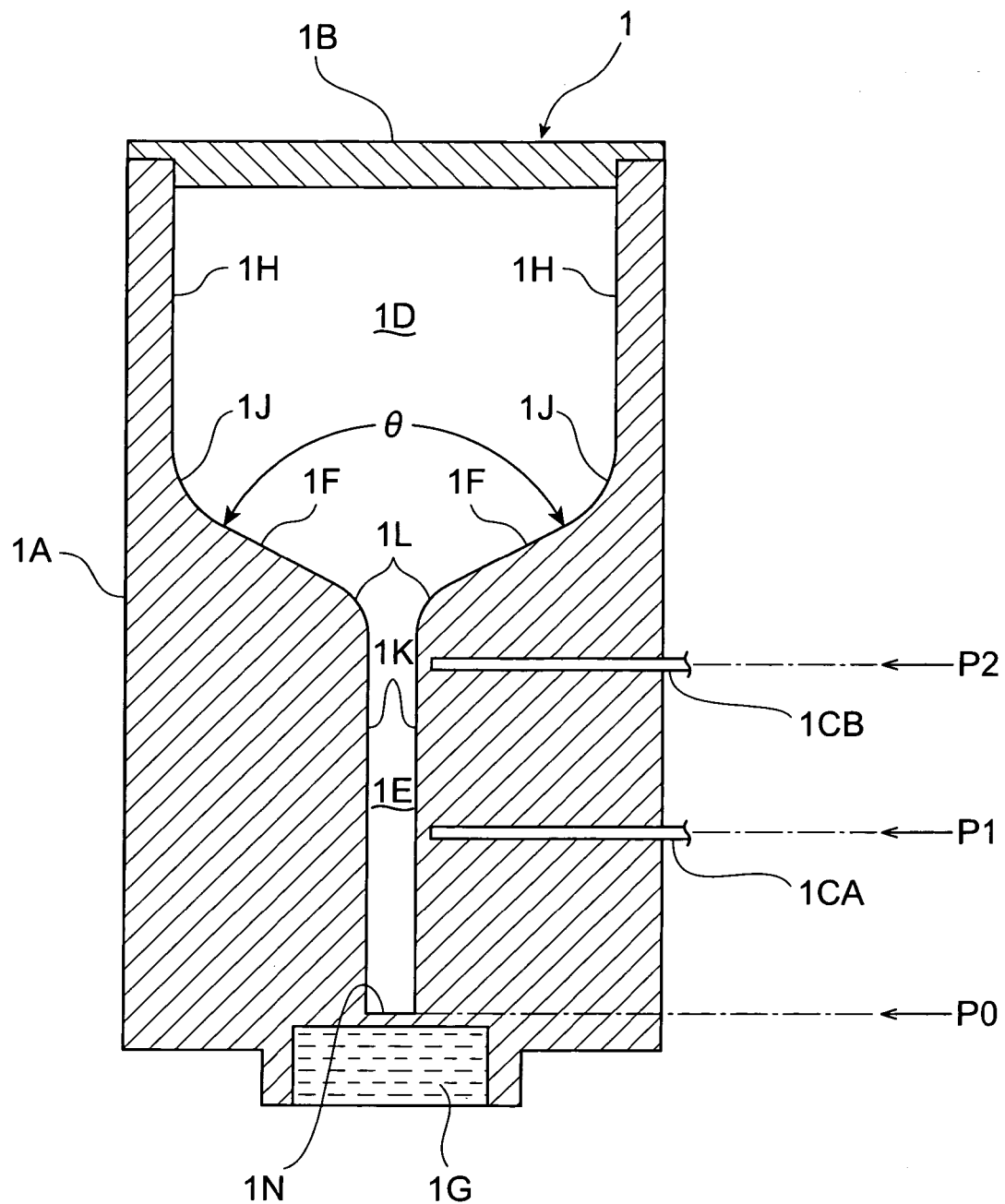
FIG. 7 is a cross-sectional view showing the structure of a crucible according to the third embodiment shown in FIG. 6.

As shown in FIG. 7, the crucible 1 of this embodiment has a construction provided with a crucible body 1A and a cover member 1B covering the opening of the crucible body 1A. The crucible body 1A is heat resistant, and is made of a material, such as a high-purity carbon material, which increases the smoothness of the inner wall and lowers the wettability of the calcium fluoride starting material M. The cover member 1B is also made of a heat resistant high-purity carbon material.

A large-diameter starting material carrying section 1D is also formed in the crucible body 1A, for loading of the calcium fluoride starting material M (see FIG. 6). A smaller seed carrying section 1E in which, for example, a cylindrical seed S (see FIG. 6) is loaded is formed as a straight circular hole from the center section of the crucible body 1A, up to the area near the bottom. A cone surface 1F forming the bottom of the starting material carrying section 1D is formed between the starting material carrying section 1D and the seed carrying section 1E. The border surface between the starting material carrying section 1D and the seed carrying section 1E is the upper edge of the seed S inserted into the seed carrying section 1E, and it is determined by the length of the seed S.

In order to forcefully cool the lower part of the seed S loaded in the seed carrying section 1E (see FIG. 6) to prevent its melting, a water jacket 1G is formed around the bottom of the seed carrying section 1E, at the bottom section of the crucible body 1A. The water jacket 1G forms a cooling water circulation channel in connection with the cooling water channels 2D, 2E in the shaft 2B (see FIG. 6).

A concave curved plane 1J is formed at the border section between the wall surface 1H and cone surface 1F of the starting material carrying section 1D, and the wall surface 1H and cone surface 1F of the starting material carrying section 1D are in a smooth connection via the concave curved plane 1J. Also, a convex curved plane 1L is formed at the border section between the cone surface 1F and the wall surface 1K of the seed carrying section 1E, and the cone surface 1F and the wall surface 1K of the seed carrying section 1E are in a smooth connection via the convex curved plane 1L.

The wall surface 1H of the starting material carrying section 1D is formed straight, and the inner diameter within the wall surface 1H may be set to, for example, 250 mm. The inner diameter of the seed carrying section 1E may be set to, for example, 20 mm.

In the crucible 1 of this embodiment, a thermocouple 1CA and thermocouple 1CB are situated near the side wall of the seed carrying section 1E, mutually separated in the vertical direction, as temperature detecting means for measurement of the internal temperature of the seed carrying section. The vertical direction may be considered to be the direction in which the seed carrying section 1E extends. In this case, the high purity carbon material used as the material for the crucible body 1A can be easily worked because it has a porous structure, and thermocouple insertion holes can be suitably formed to circumvent the effect of the temperature in the crucible. The high purity carbon material also does not react with metals normally used for thermocouples, and therefore the thermocouples can be satisfactorily situated inside the crucible 1.

Here, thermocouples employing a platinum-rhodium alloy are preferably used as the thermocouples 1CA, 1CB. Such thermocouples are optimal for precision measurement at high temperature, and therefore allow measurement of the internal temperature of the seed carrying section 1E. As an example of a thermocouple employing platinum-rhodium there may be mentioned JIS-Type B (+wire: platinum-rhodium alloy containing 30% rhodium, −wire: platinum-rhodium alloy containing 6% rhodium).

The two thermocouples allow a temperature gradient to be derived for the seed carrying section 1E based on the positions P1, P2 at which the thermocouple 1CA and thermocouple 1CB are situated and on the temperatures measured from the thermocouple 1CA and thermocouple 1CB, and by calculating the position representing the melting point of the seed S it is possible to easily determine the boundary position between the melted portion and the unmelted portion of the seed S in the seed carrying section 1E.

The thermocouple 1CA is preferably situated at a position (first position) P1 at a height above position P0, which is the height of the bottom face 1N of the seed carrying section 1E, corresponding to 25-50% of the depth of the seed carrying section 1E, while the thermocouple 1CB is preferably situated at a position (second position) P2 at a height above position P0, which is the height of the bottom face 1N of the seed carrying section 1E, corresponding to 60-80% of the depth of the seed carrying section 1E. When the seed has melted up to the range defined by the two points of the seed carrying section 1E whose temperatures have been measured by the thermocouple 1CA and thermocouple 1CB, subsequent single crystal growth will proceed in a satisfactory manner. Such a state may be easily judged by whether the melting point of the seed S falls between the temperatures measured by the thermocouple 1CA and thermocouple 1CB, without deriving the temperature gradient of the seed carrying section 1E.

A method of growing a calcium fluoride single crystal using the crucible 1 described above will now be explained.

First, the crucible 1 is prepared, the cover member 1B is removed, and the calcium fluoride seed S is loaded into the seed carrying section 1E of the crucible 1. Next, the calcium fluoride starting material M is loaded into the starting material carrying section 1D, and the starting material carrying section 1D of the crucible body 1A is closed with the cover member 1B. The crucible 1 is in a lowered state by the shaft 2B at this time.

The pressure inside the vacuum VB furnace 2 is reduced to below $10^{-4}$ Pa, and the primary heater 2AA is heated to about 1600° C. Also, the crucible 1 is raised by the shaft 2B at an imperceptible speed of about 10 mm/h and held at the raised position for about 10 hours.

At this time, the internal temperature of the seed carrying section 1E is measured by the thermocouple 1CA and thermocouple 1CB, and moving of the crucible 1 is terminated when the boundary position between the melted portion and the unmelted portion of the seed S is judged to be within the zone of the prescribed heights from the bottom face 1N of the seed carrying section 1E, based on the internal temperatures. The zone of the prescribed heights is preferably the range defined between the first position P1 at a height above the bottom face 1N of the seed carrying section 1E corresponding to 25% of the depth of the seed carrying section 1E and the second position P2 at a height above the bottom face 1N of the seed carrying section 1E corresponding to 80% of the depth of the seed carrying section 1E. More preferably, the first position P1 is at a height above the bottom face 1N of the seed carrying section 1E corresponding to 40% of the depth of the seed carrying section 1E while the second position P2 is at a height above the bottom face 1N of the seed carrying section 1E corresponding to 70% of the depth of the seed carrying section 1E, and even more preferably, the first position P1 is at a height above the bottom face 1N of the seed carrying section 1E corresponding to 50% of the depth of the seed carrying section 1E while the second position P2 is at a height above the bottom face 1N of the seed carrying section 1E corresponding to 60% of the depth of the seed carrying section 1E. This will produce a condition for satisfactory growth of a calcium fluoride single crystal along the crystal plane of the unmelted portion of the seed.

After moving of the crucible 1 has been terminated, the crucible 1 is lowered by the shaft 2B at an imperceptible speed of about 1.0 mm/h, and held at the lowered position in the vacuum VB furnace 2 for about 5 hours. This allows cooling of the melted calcium fluoride starting material M to grow a single crystal along the crystal plane of, for example, the (111) orientation of the seed S, in order to obtain the desired calcium fluoride single crystal.

This completes the explanation of the preferred embodiments of the invention, but it is needless to mention that the invention is not limited to these three embodiments.

Also, although the crucible 1 of the first embodiment satisfies all of the conditions (i) to (vi) listed below, a calcium fluoride single crystal can be easily grown so long as the crucible 1 satisfies any one of the following conditions (i) to (vi).

(i) The crucible inner surface has a surface roughness of no greater than Rmax 6.4s according to the maximum height method;

(ii) A tapered cone surface is formed between the starting material carrying section in which the calcium fluoride starting material is loaded and the seed carrying section in which the seed is loaded, and the wall surface of the starting material carrying section is smoothly connected to the cone surface via a concave curved plane while the cone surface is smoothly connected to the wall surface of the seed carrying section via a convex curved plane;

(iv) the cone angle of the tapered cone surface formed between the starting material carrying section in which the calcium fluoride starting material is loaded and the seed carrying section in which the seed is loaded is set in a range between 95° and 150°;

(v) the water droplet contact angle with the crucible inner surface is no greater than 100°;

(vi) the crucible comprises a starting material carrying section in which the calcium fluoride starting material is loaded and a seed carrying section in which the seed is loaded, and the bottom of the seed carrying section has a shape matching the edge of the seed.

For example, raising the crucible 1 by the shaft 2B at an imperceptible speed in the third embodiment described above results in melting of the calcium fluoride starting material M, but the same effect of the third embodiment may also be achieved by controlling the primary heater 2AA to heat the crucible 1 while the crucible 1 is already raised with the shaft 2B.

Also, a thermocouple may be situated at a position near the side wall of the starting material carrying section 1D of the third embodiment for measurement of the internal temperature of the starting material carrying section 1D, thereby facilitating temperature regulation of the primary heater 2AA and secondary heater 2AB. In addition, a thermometer may be situated in the water jacket 1G to facilitate temperature regulation of the cooling water, in order to maintain a more constant temperature for cooling of the lower portion of the seed S.

Also if the border surface between the starting material carrying section 1D and seed carrying section 1E is below the convex curved plane 1L in the third embodiment, calculation of the temperature gradient of the seed carrying section 1E can be accomplished even if thermocouples are situated at a position near the surface defined between the convex curved plane 1L and the wall surface 1K of the seed carrying section 1E and at a position near the wall surface 1K of the seed carrying section 1E.

In addition, although two thermocouples were situated in the crucible 1 of the third embodiment, a single thermocouple may be situated at a position near the side wall of the seed carrying section 1E in the zone defined between a first position at a height above the bottom end of the seed carrying section 1E corresponding to 25% of the depth of the seed carrying section 1E and a second position at a height above the bottom end of the seed carrying section 1E corresponding to 80% of the depth of the seed carrying section 1E. In this case, once the temperature of the thermocouple reaches the melting point of the seed S, the boundary position between the melted portion and unmelted portion of the seed S in the seed carrying section 1E will have reached the position of the thermometer of the thermocouple, and therefore terminating moving of the crucible 1 at this point will allow satisfactory growth of the calcium fluoride single crystal along the crystal plane of the unmelted portion of the seed. The preferred positions and particularly preferred positions for the first position and second position in this case are the same as for the third embodiment described above.

In the first to third embodiments described above the seed was composed of calcium fluoride, but the crucible of the invention and the single crystal growth method employing it may also be applied for optical part materials wherein the seed is a material other than calcium fluoride (for example, barium fluoride or magnesium fluoride).

EXPERIMENTAL EXAMPLES

Experimental examples will now be described.

Experimental Examples 1-5

For Experimental Examples 1-5, crucibles 1 having different inner surface roughnesses of the crucible body 1A and different glass-like carbon (GC) coating thicknesses were used for growth of calcium fluoride ($CaF_2$) single crystals with a vacuum VB furnace 2, and the incidence of polycrystal formation in the obtained crystals was measured and evaluated.

The surface roughness was measured according to the maximum height method, by three-dimensional shape measurement using an OLS1100 scanning confocal laser microscope by Shimadzu Laboratories. The incidence of polycrystals was observed using two Polar films by Edmund Industrial Optics (color: gray, area: 15 in.×8.5 in., thickness: 0.29 mm). Specifically, the two films were placed together with their film sides facing parallel and sandwiching the crystal, and the crystal was observed from one side while irradiating a light source from the opposite side of the film. The crystal angle and position were changed and the non-single crystal portion was measured as polycrystalline. The final polycrystalline portion volume was calculated, and the ratio of the total crystal volume and the polycrystalline portion volume was determined as the incidence of polycrystal formation. Crystals with an incidence of polycrystal formation of less than 30% were evaluated as ◎, and those above 70% were evaluated as ○.

The evaluation results are shown in Table 1, which clearly shows that if the crucible inner surface is coated with glass-like carbon (GC) and has a surface roughness of about Rmax 3.2s, as in Experimental Example 1 and Experimental Example 2, the incidence of polycrystal formation is 30% or lower and a calcium fluoride ($CaF_2$) single crystal is easily grown. It also clearly shows that even if no glass-like carbon (GC) coating is present and the surface roughness of the crucible inner surface is about Rmax 6.4s, as in Experimental Example 3, the incidence of polycrystal formation is still 30% or lower and a calcium fluoride ($CaF_2$) single crystal is easily grown.

However, in the case of a rough surface where the surface roughness of the crucible inner surface is below Rmax 25s, as in Experimental Examples 4 and 5, regardless of whether or not a glass-like carbon (GC) coating is present, the incidence of polycrystal formation is 70% or greater. This demonstrated that the crucibles of Experimental Examples 1-3 allowed easier growth of calcium fluoride ($CaF_2$) single crystals compared to the crucibles of Experimental Examples 4-5.

TABLE 1

|  | Crucible inner surface roughness | GC coating thickness | Evaluation |
|---|---|---|---|
| Exp. Example 1 | $R_{max}$ 3.2s | 2.0 mm | ◎ |
| Exp. Example 2 | $R_{max}$ 3.2s | 1.0 mm | ◎ |
| Exp. Example 3 | $R_{max}$ 6.4s | 0 mm | ◎ |
| Exp. Example 4 | $R_{max}$ 25s | 1.0 mm | ○ |
| Exp. Example 5 | $R_{max}$ 50s | 0 mm | ○ |

Experimental Examples 6-10

For Experimental Examples 6-10, crucibles 1 having different contact angles between the inner surface of the crucible body 1A and water droplets, and different glass-like carbon (GC) coating thicknesses were used for growth of calcium fluoride ($CaF_2$) single crystals with a vacuum VB furnace 2, and the incidence of polycrystal formation in the obtained crystals was measured and evaluated.

The contact angle was measured by the maximum height method, by three-dimensional shape measurement using an OLS1100 scanning confocal laser microscope by Shimadzu Laboratories. The incidence of polycrystals was observed using two Polar films by Edmund Industrial Optics (color: gray, area: 15 in.×8.5 in., thickness: 0.29 mm). Specifically, the two films were placed together with their film sides facing parallel and sandwiching the crystal, and the crystal was observed from one side while irradiating a light source from the opposite side of the film. The crystal angle and position were changed and the non-single crystal portion was measured as a polycrystalline. The final polycrystalline portion volume was calculated, and the ratio of the total crystal volume and the polycrystalline portion volume was determined as the incidence of polycrystal formation. Crystals with an incidence of polycrystal formation of less than 30% were evaluated as ◎, and those above 70% were evaluated as ○.

The evaluation results are shown in Table 2, which clearly shows that if the crucible inner surface is coated with glass-like carbon (GC) to a thickness of at least 1.5 mm and the contact angle between the surface and water droplets is no greater than 100°, as in Experimental Examples 6-8, the incidence of polycrystal formation is 30% or lower.

However, in cases where the glass-like carbon (GC) coating thickness was less than 1 mm and the contact angle between the surface and water droplets exceeded 100°, as in Experimental Examples 9 and 10, the incidence of polycrystal formation was 70% or greater. This demonstrated that the crucibles of Experimental Examples 6-8 allowed easier growth of calcium fluoride ($CaF_2$) single crystals compared to the crucibles of Experimental Examples 9 and 10.

TABLE 2

|  | Contact angle between crucible inner surface and water droplets | GC coating thickness | Evaluation |
|---|---|---|---|
| Exp. Example 6 | 85° | 2.0 mm | ◎ |
| Exp. Example 7 | 90° | 1.5 mm | ◎ |
| Exp. Example 8 | 100° | 1.5 mm | ◎ |
| Exp. Example 9 | 107° | 1.0 mm | ○ |
| Exp. Example 10 | 127° | 0 mm | ○ |

Experimental Example 11

The crucible 1 shown in FIG. 1 was prepared first. The crucible body 1A, cover member 1B and bottom member 1C were all constructed of high-purity carbon (high-purity carbon by Nippon Carbon Co., Ltd.). The wall surface 1K of the seed carrying section 1E was cylindrical, and the inner diameter was 20 mm. The bottom face of the seed carrying section 1E was flat and vertical with respect to the wall surface 1K. The wall surface of the starting material carrying section was also cylindrical, with an inner diameter of 250 mm. The curvature radius of the concave curved plane 1J was 60 mm, and the curvature radius of the convex curved plane was 50 mm. The inner surface of the starting material carrying section 1D and the inner surface of the seed carrying section were coated with glass-like carbon (Glass-like carbon coat by Nisshinbo Industries, Inc.) to an impregnating layer thickness of 1.0 mm, and the water droplet contact angle was 90°.

The cover member 1B of this crucible 1 was removed, and a cylindrical seed S with a diameter of 10 mm and a length of 10 cm was loaded into the seed carrying section 1E of the crucible 1. The material of the seed S used was calcium fluoride, and the seed S had a shape with flat edges.

The calcium fluoride starting material M was then loaded into the starting material carrying section 1D. Next, the starting material carrying section 1D of the crucible body 1A was closed with the cover member 1B.

The pressure inside the vacuum VB furnace 2 was then reduced to below $10^{-4}$ Pa, the heater 2A was heated to about 1400-1500° C., and the crucible 1 was raised at an imperceptible speed of about 10 mm/h by the shaft 2B and held at the raised position for about 10 hours. During that period, the lower part of the seed S was forcefully cooled through the heat transfer member 2D by cooling water circulating in the shaft 2B from the inner conduit 2B1 to the outer conduit 2B2.

After the calcium fluoride starting material M melted, the crucible 1 was lowered by the shaft 2B at an imperceptible speed of about 1.0 mm/h and was held at the lowered position in the vacuum VB furnace 2 for about 5 hours. The melted calcium fluoride ($CaF_2$) starting material M was thus cooled to grow a single crystal along the crystal plane of the (111) orientation of the seed S.

Next, the solidified calcium fluoride ($CaF_2$) in the crucible 1 was cooled at a cooling rate of about 30° C./h by ON/OFF control of the heater 2A of the vacuum VB furnace 2.

Experimental Example 12

A crucible was prepared in the same manner as Experimental Example 1, except that the bottom face of the seed carrying section 1E was conical, and this crucible was used to grow a single crystal of calcium fluoride in the same manner as Experimental Example 11.

(Evaluation of Crystal Quality)

The single crystals of calcium fluoride obtained in Experimental Examples 11 and 12 were set between two Polar films by Edmund Industrial Optics (color: gray, area: 15 in.×8.5 in., thickness: 0.29 mm) with the two film faces placed together facing parallel, the crystal was observed from the outside of one film while irradiating a light source from the outside of the other film, and the crystal angle and position were changed for measurement of the non-single crystal portion as polycrystalline. The final polycrystalline portion volume was calculated, and the ratio of the total crystal volume and the polycrystalline portion volume was determined as the incidence of polycrystal formation. As a result, the incidence of polycrystal formation was below 30% in the single crystal of Experimental Example 11, while the incidence of polycrystal formation was above 30% in the single crystal of Experimental Example 12. This indicated that the single crystal of Experimental Example 11 was of superior crystalline quality compared to the single crystal of Experimental Example 12. Thus, it was confirmed that a single crystal of satisfactory crystalline quality can be obtained by eliminating gaps between the bottom face of the seed and the bottom face of the seed carrying section.

Experimental Example 13

A crucible made of high-purity carbon was prepared with $\phi$175 mm outer diameter×325 mm height ($\phi$10 mm inner diameter×100 mm height of the seed carrying section), and thermocouples (JIS-Type B) with $\phi$3.5 mm diameter×80 mm length were mounted at three locations, 50 mm above the bottom end of the seed carrying section, 95 mm above the bottom end of the seed carrying section and near the starting material carrying section.

Figure 8:
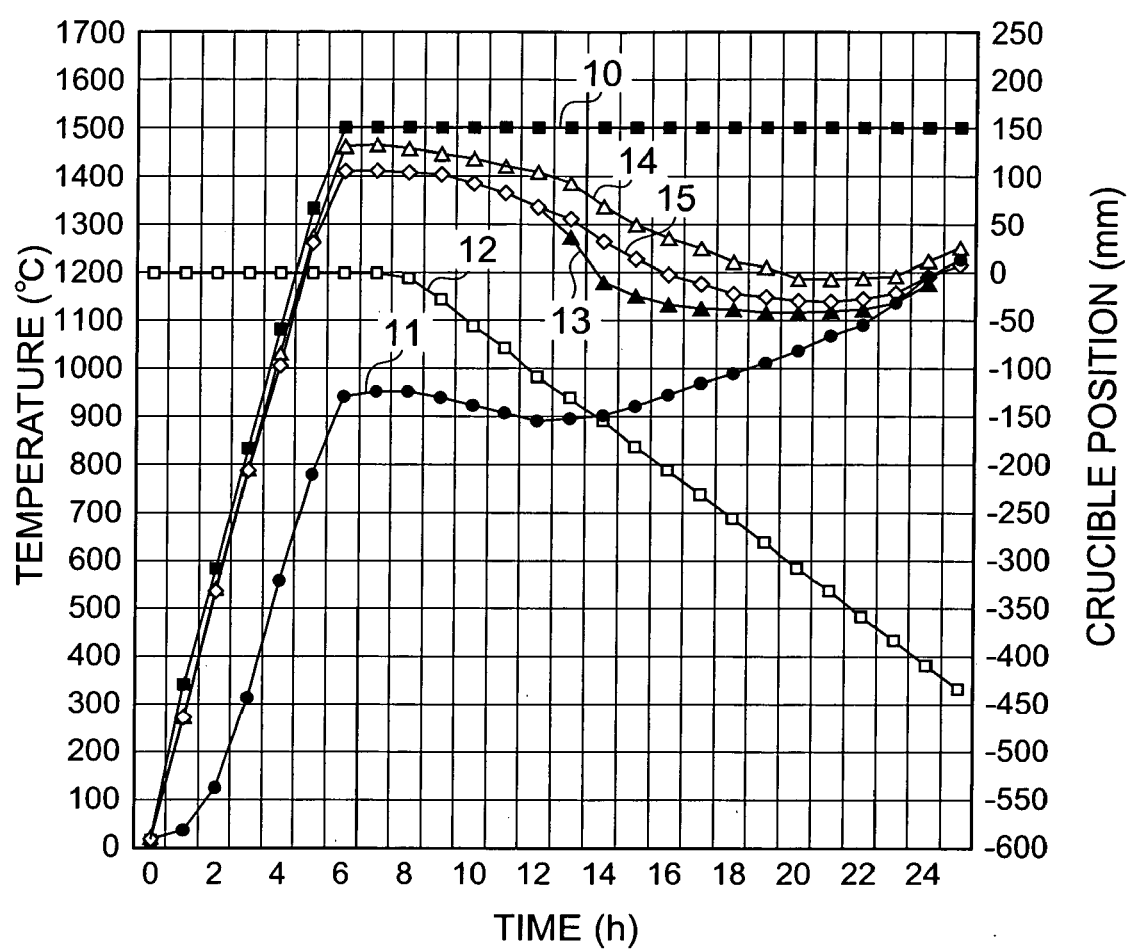
FIG. 8 is a graph showing the relationship between crucible position, heater temperature and thermocouple temperature for a vacuum VB furnace provided with a crucible according to an experimental example of the invention.

FIG. 8 shows the relationship between the crucible position and thermocouple temperature, when the pressure inside the vacuum VB furnace 2 was reduced to below $10^{-4}$ Pa while the crucible interior was empty, and with the crucible heated by the primary and secondary heaters. The crucible position 12 was initially at the position shown in FIG. 6, and the crucible was lowered with time. The primary heater temperature 10 was kept at 1500° C., and the secondary heater temperature 11 was increased to about 950° C. and then regulated. The temperatures at the three locations of the crucible, specifically the temperature 13 of the thermocouple 50 mm above the bottom end of the seed carrying section, the temperature 14 of the thermocouple 95 mm above the bottom end of the seed carrying section and the temperature 15 of the thermocouple near the starting material carrying section, clearly are in correlation with the primary heater temperature 10, secondary heater temperature 11 and crucible position 12.

A high-purity calcium fluoride single crystal ($\phi$10 mm diameter×100 mm length, crystal orientation (111) in lengthwise direction, product of Hitachi Chemical Co., Ltd.) was loaded as the seed into the seed carrying section of the crucible, and high-purity calcium fluoride powder (product of Stella Chemifa Corp.) was loaded as the calcium fluoride starting material into the starting material carrying section. In addition, high-purity zinc fluoride powder (product of Stella Chemifa Corp.) was included as an additive with the calcium fluoride starting material. The crucible position was in the lowermost state.

Next, the pressure inside the vacuum VB furnace was reduced to below $10^{-4}$ Pa, the primary heater was heated to about 1500° C., and the crucible position was raised at a speed of 10 mm/h and held at the raised position for about 10 hours. During this time, the temperature at each position was measured by the thermocouples, and the primary heater moving was terminated when the boundary position between the melted portion and unmelted portion of the seed loaded in the seed carrying section reached a position 50 mm above the bottom end of the seed carrying section, at which time the crucible position was lowered at a speed of no greater than 0.7 mm/h and held at the lowered position inside the vacuum VB furnace for 5 hours. The inside of the vacuum VB furnace was then cooled at a rate of 50-100° C./h. When the crucible interior temperature fell below 50° C., nitrogen was introduced into the vacuum VB furnace to atmospheric pressure, and the crystal in the crucible was removed.

Experimental Examples 14-18

A calcium fluoride crystal was obtained for Experimental Example 14 in the same manner as Experimental Example 13, except that the boundary position between the melted portion and unmelted portion of the seed loaded in the seed carrying section, upon termination of heating by the primary heater and secondary heater, was at a position 80 mm above the bottom end of the seed carrying section. A calcium fluoride crystal was also obtained for Experimental Example 15 in the same manner as Experimental Example 13, except that the boundary position between the melted portion and unmelted portion of the seed loaded in the seed carrying section, upon termination of moving by the primary heater and secondary heater, was at a position 70 mm above the bottom end of the seed carrying section. A calcium fluoride crystal was also obtained for Experimental Example 16 in the same manner as Experimental Example 13, except that the boundary position between the melted portion and unmelted portion of the seed loaded in the seed carrying section, upon termination of moving by the primary heater and secondary heater, was at a position 60 mm above the bottom end of the seed carrying section. A calcium fluoride crystal was also obtained for Experimental Example 17 in the same manner as Experimental Example 13, except that the boundary position between the melted portion and unmelted portion of the seed loaded in the seed carrying section, upon termination of moving by the primary heater and secondary heater, was at a position 40 mm above the bottom end of the seed carrying section. A calcium fluoride crystal was also obtained for Experimental Example 18 in the same manner as Experimental Example 13, except that the boundary position between the melted portion and unmelted portion of the seed loaded in the seed carrying section, upon termination of moving by the primary heater and secondary heater, was at a position 25 mm above the bottom end of the seed carrying section.

Experimental Examples 19 and 20

A calcium fluoride crystal was obtained for Experimental Example 19 in the same manner as Experimental Example 13, except that the boundary position between the melted portion and unmelted portion of the seed loaded in the seed carrying section, upon termination of moving by the primary heater and secondary heater, was at a position 85 mm above the bottom end of the seed carrying section. A calcium fluoride crystal was also obtained for Experimental Example 20 in the same manner as Experimental Example 13, except that the boundary position between the melted portion and unmelted portion of the seed loaded in the seed carrying section, upon termination of moving by the primary heater and secondary heater, was at a position 20 mm above the bottom end of the seed carrying section.

Each of the calcium fluoride crystals of Experimental Examples 13-20 was sandwiched between two polarizing films rotated at 90° from each other, and upon visual observation of light transmission with irradiation by an illuminator, the grain boundary was observed between the area with no light transmission and the area with light transmission. If no grain boundary is observed, then the crystal is judged to be completely single crystal. After further working into a disc shape (φ150 mm×100 mm thickness) using a cutter and polishing with a mirror polisher, single crystallinity or polycrystallinity was reconfirmed in the same manner. The crystal orientation was confirmed by the X-ray/Laue method. The judgment was determined to be poor if the obtained crystal was polycrystalline, or if the volume of the single crystal portion, i.e. the portion having the same crystal orientation (111) as the seed, was less than 50 vol %, and the number of poorly formed crystals out of the number of tests (10) was evaluated. The conditions and results for Experimental Examples 13-20 are shown together in FIG. 9.

As is clear from FIG. 9, the most satisfactory calcium fluoride single crystal yields were obtained in Experimental Example 13 and Experimental Example 16, the second most satisfactory calcium fluoride single crystal yields were obtained in Experimental Example 15 and Experimental Example 17, and the third most satisfactory calcium fluoride single crystal yields were obtained in Experimental Example 14 and Experimental Example 18. In Experimental Examples 19 and 20, the crystal form of the calcium fluoride was polycrystalline, and single crystals could not be obtained.

The invention claimed is:

1. A crucible for growth of a single crystal along the crystal plane of a seed by melting and cooling an optical part material, comprising a starting material carrying section in which the starting material of said optical part material is loaded and a seed carrying section in which said seed is loaded characterized in that a tapered cone surface is formed between the starting material carrying section and the seed carrying section in which said seed is loaded, the wall surface of said starting material carrying section is smoothly connected to the cone surface via a concave curved surface having a curvature radius of at least 1/10 of an inner diameter within the wall surface of the starting material carrying section, and said cone surface is smoothly connected to the wall surface of the seed carrying section via a convex curved surface having a curvature radius of at least 1/10 of an inner diameter within the wall surface of the starting material carrying section, and further characterized in that the surface roughness of the inner surface of the crucible as measured by the maximum height method is no greater than $R_{max}$ 6.4s.

2. A crucible according to claim 1, wherein the crucible inner surface is composed of glossy glass-like carbon.

3. A crucible according to claim 1, wherein the crucible is composed of carbon as the material.

4. A crucible according to claim 1, wherein said optical part material is calcium fluoride.

* * * * *